United States Patent
Cheng et al.

(10) Patent No.: US 12,133,417 B2
(45) Date of Patent: Oct. 29, 2024

(54) DISPLAYING SUBSTRATE, MANUFACTURING METHOD THEREOF AND DISPLAY PANEL

(71) Applicants: Hefei Xinsheng Optoelectronics Technology Co., Ltd., Anhui (CN); BOE Technology Group Co., Ltd., Beijing (CN)

(72) Inventors: Leilei Cheng, Beijing (CN); Yongchao Huang, Beijing (CN); Qinghe Wang, Beijing (CN); Yang Zhang, Beijing (CN); Bin Zhou, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 11 days.

(21) Appl. No.: 17/432,462

(22) PCT Filed: Feb. 24, 2021

(86) PCT No.: PCT/CN2021/077695
§ 371 (c)(1),
(2) Date: Aug. 19, 2021

(87) PCT Pub. No.: WO2021/185037
PCT Pub. Date: Sep. 23, 2021

(65) Prior Publication Data
US 2023/0380215 A1    Nov. 23, 2023

(30) Foreign Application Priority Data

Mar. 20, 2020   (CN) ...................... 202010202995.5

(51) Int. Cl.
*H10K 59/12*    (2023.01)
*H10K 59/121*   (2023.01)
(Continued)

(52) U.S. Cl.
CPC ..... *H10K 59/1201* (2023.02); *H10K 59/1213* (2023.02); *H10K 59/32* (2023.02);
(Continued)

(58) Field of Classification Search
CPC .......... H10K 59/1201; H10K 59/1213; H10K 59/124; H10K 59/32; H10K 59/82; H10K 59/87; H10K 77/10; H10K 71/20
See application file for complete search history.

(56) References Cited

U.S. PATENT DOCUMENTS

2020/0411617 A1* 12/2020 Kishimoto ......... H10K 59/1213

\* cited by examiner

*Primary Examiner* — Brook Kebede
(74) *Attorney, Agent, or Firm* — IPro, PLLC

(57) ABSTRACT

The disclosure relates to the technical field of display, in particular to a displaying substrate, a manufacturing method thereof and a display panel. The displaying substrate comprises a passivation layer (28) and a flat layer (29) covering the passivation layer (28), wherein the flat layer (29) comprises a first flat via hole and a plurality of second flat via holes, the passivation layer (28) comprises a first passivation via hole, and the first flat via hole and the first passivation via hole form a first sleeve hole (31); and the hole depth of the first flat via hole is smaller than that of each second flat via hole, and the hole depth of the first passivation via hole is greater than or equal to the difference between the maximum hole depth of all the second flat via holes and the hole depth of the first flat via hole.

20 Claims, 4 Drawing Sheets

(51) Int. Cl.
  *H10K 59/32*   (2023.01)
  *H10K 59/80*   (2023.01)
  *H10K 59/82*   (2023.01)
  *H10K 71/20*   (2023.01)
  *H10K 77/10*   (2023.01)
  *G02F 1/13*    (2006.01)

(52) U.S. Cl.
  CPC ............. *H10K 59/82* (2023.02); *H10K 59/87* (2023.02); *H10K 71/20* (2023.02); *H10K 77/10* (2023.02); *G02F 1/1306* (2013.01)

DISPLAYING SUBSTRATE, MANUFACTURING METHOD THEREOF AND DISPLAY PANEL

The disclosure claims the priority of a Chinese patent application filed in the China National Intellectual Property Administration on Mar. 20, 2020 with application number 202010202995.5 and application name "Displaying Substrate, Manufacturing Method thereof and Display Panel", the entire contents of which are hereby incorporated by reference.

TECHNICAL FIELD

The disclosure relates to the technical field of display, in particular to a displaying substrate, a manufacturing method thereof and a display panel.

BACKGROUND

An organic light-emitting diode (OLED) is a thin-film light-emitting device made of an organic semiconductor material, which has the characteristic of self-illumination.

As people's demand for display increases day-by-day, OLEDs have received significant attention in the high-precision and large-size TV display technology. In existing OLED technology, an organic luminescent layer EL needs to be prepared on a film surface with good flatness to ensure the luminous efficiency of the device and the service life of a luminescent material.

SUMMARY

The embodiments of the disclosure provide a displaying substrate, a manufacturing method thereof and a display panel.

The embodiments of the disclosure adopt the following technical solution:

In one aspect, a displaying substrate is provided, which comprises an active area and a non-active area at least located on one side of the active area. The displaying substrate further comprises a passivation layer and a flat layer covering the passivation layer, wherein the passivation layer and the flat layer are located in the active area and the non-active area.

The flat layer comprising a first flat via hole in the non-active area and a plurality of second flat via holes in the active area;

the passivation layer comprising a first passivation via hole located in the non-active area, and the first flat via hole and the first passivation via hole form a first sleeve hole; and the hole depth of the first flat via hole is less than that of each second flat via hole, and the hole depth of the first passivation via hole is greater or equal to the difference between the maximum hole depth of the second flat via holes and the hole depth of the first flat via hole.

Optionally, the passivation layer further comprising a plurality of second passivation via holes located in the active area;

the plurality of second flat via holes and the plurality of second passivation via holes form a plurality of second sleeve holes; and the passivation layer and the flat layer form a step on an inner wall of each second sleeve hole, and a partial flat layer is arranged on the step.

Optionally, the displaying substrate further comprising a supporting base, and the passivation layer and the flat layer are formed on the supporting base.

Optionally, each second flat via hole comprising a connected first flat sub-via hole with a second flat sub-via hole, the first flat sub-via hole is away from the supporting base, and the second flat sub-via hole is close to the supporting base; and the step is located on the side close to the supporting base of the first flat sub-via hole, and it is adjacent to the second flat sub-via hole.

Optionally, in the direction perpendicular to the supporting base, the cross section of the first flat sub-via hole and the cross section of the second flat sub-via hole each comprise a first top edge and a first bottom edge opposite the first top edge, the first top edge is away from the supporting base, and the first bottom edge is close to the supporting base; length of the first top edge is greater than length of the first bottom edge; and the length of the first bottom edge of the first flat sub-via hole is greater than of the length of the first top edge of the second flat sub-via hole.

Optionally, the displaying substrate further comprising a first metal layer, and the passivation layer covers the first metal layer; and the first metal layer comprising a first metal part in the non-active area and a second metal part in the active area, the first metal part is located below the first sleeve hole, and the second metal part is located below the plurality of second sleeve holes.

Optionally, the second metal part comprising a source electrode and a drain electrode, and the source electrode and the drain electrode are respectively located below different second sleeve holes.

Optionally, the displaying substrate further comprising an anode, the anode is located on the side away from the passivation layer of the flat layer, and the anode is electrically connected with the second metal part through the second sleeve hole.

Optionally, the displaying substrate further comprises a buffer layer, an active layer, a gate insulating layer, a gate metal layer and an interlayer dielectric layer, the active layer comprises a semiconductor part and conductive parts on both sides of the semiconductor part, and the gate metal layer comprises a gate located in the active area and an electrode located in the non-active area.

An embodiment of the disclosure provides a displaying substrate, which comprises an active area and a non-active area at least located on one side of the active area. The displaying substrate further comprises a passivation layer and a flat layer covering the passivation layer, wherein the passivation layer and the flat layer are located in the active area and the non-active area; the flat layer comprises a first flat via hole located in the non-active area and a plurality of second flat via holes located in the active area; the passivation layer comprises a first passivation via hole located in the non-active area, and the first flat via hole and the first passivation via hole form a first sleeve hole; the hole depth of the first flat via hole is less than that of each second flat via hole; and the hole depth of the first passivation via hole is greater than or equal to the difference between the maximum hole depth of all the second flat via holes and the hole depth of the first flat via hole.

In another aspect, a display panel is provided, which comprises the above displaying substrate.

Optionally, the display panel may be a twisted nematic type liquid crystal display panel, a vertical alignment type liquid crystal display panel, an in-plane switching type liquid crystal display panel, an advanced super dimension switch type liquid crystal display panel or an OLED display panel.

In yet another aspect, a manufacturing method of a displaying substrate is provided, and the method comprises:

forming a passivation layer and a flat layer covering the passivation layer, wherein the passivation layer and the flat layer are located in the active area and the non-active area;

etching the flat layer of a first flat via hole area in the non-active area and a second flat via hole area in the active area for the first time to form a first flat via hole in the first flat via hole area and at least one first flat sub-via hole in the second flat via hole area, wherein the depth of the first etching is the hole depth of the first flat via hole; and etching the passivation layer in the first flat via hole area and the second flat via hole area and the flat layer in the second flat via hole area for the second time to form a first passivation via hole and at least one second flat sub-via hole, wherein the at least one first flat sub-via hole and the at least one second flat sub-via hole form at least one second flat via hole, the first passivation via hole and the first flat via hole form a first sleeve hole, the hole depth of the first flat via hole is smaller than that of each second flat via hole, the depth of the second etching is the hole depth of the first passivation via hole, and the hole depth of the first passivation via hole is greater than or equal to the difference between the maximum hole depth of the second flat via holes and the hole depth of the first flat via hole.

Optionally, the method further comprises:

An embodiment of the disclosure provides a manufacturing method of a displaying substrate, and the displaying substrate comprises an active area and a non-active area at least located on one side of the active area. The method comprises: forming a passivation layer and a flat layer covering the passivation layer, wherein the passivation layer and the flat layer are located in the active area and the non-active area; etching the flat layer of a first flat via hole area in the non-active area and a second flat via hole area in the active area for the first time to form a first flat via hole in the first flat via hole area and at least one first flat sub-via hole in the second flat via hole area, wherein the depth of the first etching is the hole depth of the first flat via hole; and etching the passivation layer in the first flat via hole area and the second flat via hole area and the flat layer in the second flat via hole area for the second time to form a first passivation via hole and at least one second flat sub-via hole, wherein the at least one first flat sub-via hole and the at least one second flat sub-via hole form at least one second flat via hole, the first passivation via hole and the first flat via hole form a first sleeve hole, the hole depth of the first flat via hole is smaller than that of each second flat via hole, the depth of the second etching is the hole depth of the first passivation via hole, and the hole depth of the first passivation via hole is greater than or equal to the difference between the maximum hole depth of the second flat via holes and the hole depth of the first flat via hole.

Optionally, the method further comprising:

forming a protective layer, wherein the protective layer covers the first sleeve hole; and etching the passivation layer located in the second flat via hole area for the third time to form at least one second passivation via hole, wherein the second passivation via holes and the second flat via holes form second sleeve holes.

Optionally, the displaying substrate further comprising a supporting base, and the passivation layer and the flat layer are formed on the supporting base;

in the direction perpendicular to the supporting base, the cross section of the first flat sub-via hole and the cross section of the second flat sub-via hole each comprise a first top edge and a first bottom edge opposite the first top edge, the first top edge is away from the supporting base, and the first bottom edge is close to the supporting base; the length of the first top edge is greater than the length of the first bottom edge; and the length of the first bottom edge of the first flat sub-via hole is greater than that of the first top edge of the second flat sub-via hole.

Optionally, before forming a passivation layer and a flat layer covering the passivation layer, the method further comprises:

forming a first metal layer, wherein the passivation layer covers the first metal layer the first metal layer comprises a first metal part located in the non-active area and a second metal part located in the active area.

Optionally, the second etching further comprises:

after the first passivation via hole is formed, exposing the first metal part.

Optionally, after the third etching, the method further comprises:

forming an anode on the flat layer, wherein the anode is in contact with the source electrode through the second sleeve hole above the source electrode.

Optionally, before forming a first metal layer, the method further comprises:

sequentially forming an active layer, a gate insulating layer, a gate metal layer and an interlayer dielectric layer; and the first metal layer is formed on the interlayer dielectric layer, the active layer comprises a semiconductor part and conductive parts on both sides of the semiconductor part, and the source electrode and the drain electrode are electrically connected with the conductive parts respectively.

Optionally, before sequentially forming an active layer, a gate insulating layer and a gate metal layer, the method further comprises:

forming a buffer layer located in the active area and the non-active area on the supporting base.

The above description is only an overview of the technical solution of this disclosure, which can be implemented according to the contents of the specification in order to understand the technical means of this disclosure more clearly, and in order to make the above and other objects, features and advantages of this disclosure more obvious and understandable, the detailed description of this disclosure will be given below.

BRIEF DESCRIPTION OF THE DRAWINGS

In order to explain the technical solution in the embodiments of the disclosure or the related art more clearly, the drawings used in the description of the embodiments or related arts will be briefly introduced below. Obviously, the drawings in the following description are only some embodiments of the disclosure, and for those of ordinary skill in the art, other drawings can be obtained according to these drawings without paying creative labor.

DETAILED DESCRIPTION

The technical solution in the embodiments of the disclosure will be clearly and completely described below with reference to the drawings in the embodiments of the disclosure. Obviously, the described embodiments are only part of the embodiments of the disclosure, not all of the embodiments. Based on the embodiments in the disclosure, all other embodiments obtained by those of ordinary skill in the art without creative labor are within the scope of protection of the disclosure.

In the embodiments of the disclosure, words such as "first" and "second" are used to distinguish the same items or similar items with basically the same function and effect, and are only to clearly describe the technical solution of the embodiments of the disclosure, but not to be understood as indicating or implying relative importance or implicitly indicating the number of indicated technical features.

In the embodiments of the disclosure, "a plurality" means two or more, and "at least one" means one or more, unless otherwise specifically defined.

Figure 8:
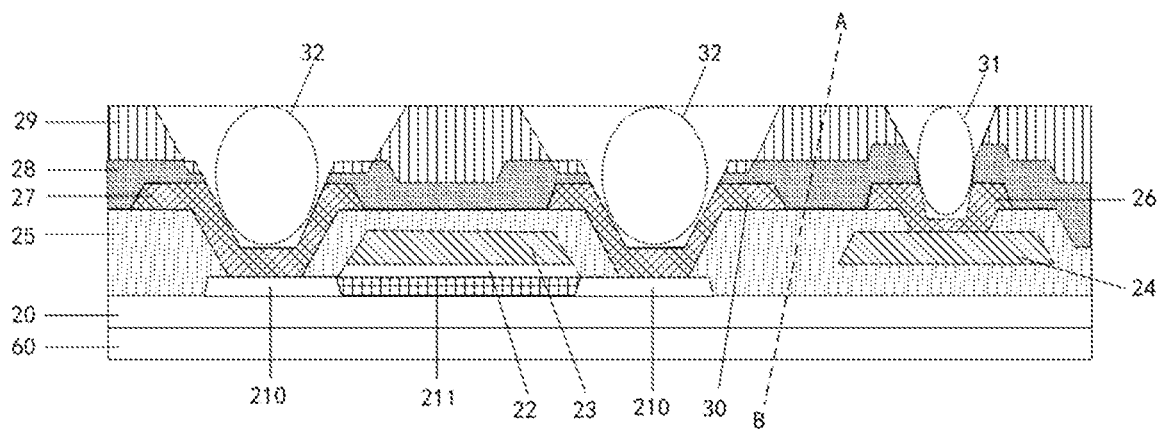
FIG. 8 is a diagram of a seventh displaying substrate provided by an embodiment of the disclosure.

An embodiment of the disclosure provides a displaying substrate, which comprises an active area and a non-active area at least located on one side of the active area. Referring to FIG. 8, the displaying substrate comprises a passivation layer 28 and a flat layer 29 covering the passivation layer 28, and the passivation layer and the flat layer are located in the active area and the non-active area.

The flat layer comprises a first flat via hole in the non-active area and a plurality of second flat via holes in the active area, the passivation layer comprises a first passivation via hole located in the non-active area, and the first flat via hole and the first passivation via hole form a first sleeve hole 31.

The hole depth of the first flat via hole is smaller than that of each second flat via hole, and the hole depth of the first passivation via hole is greater than or equal to the difference between the maximum hole depth of the second flat via holes and the hole depth of the first flat via hole.

Optionally, the passivation layer further comprises a plurality of second passivation via holes located in the active area, the plurality of second flat via holes and the plurality of second passivation via holes form a plurality of second sleeve holes 32, the passivation layer 28 and the flat layer 29 form a step (70 in FIG. 9) on an inner wall of each second sleeve hole 32, and a partial flat layer (M area and N area in FIG. 10) is arranged on the step.

By way of example, the plurality of second flat via holes and the plurality of second passivation via holes are in a one-to-one correspondence relationship.

The displaying substrate can be used to form a liquid crystal display panel or an organic light-emitting diode (OLED) display panel, which is not limited here.

The difference between the via holes etched at different thicknesses of the flat layer of the displaying substrate is small, which solves the problem of metal oxidation caused by over-etching, thereby reducing the influence on subsequent metal film layer overlapping and signal transmission; besides, the passivation layer and the flat layer form the step on the inner wall of each second sleeve hole, and the partial flat layer is arranged on the step, which can better protect a metal structure below from oxidation; and a manufacturing method of the following embodiment can be deduced from this structure.

Figure 9:
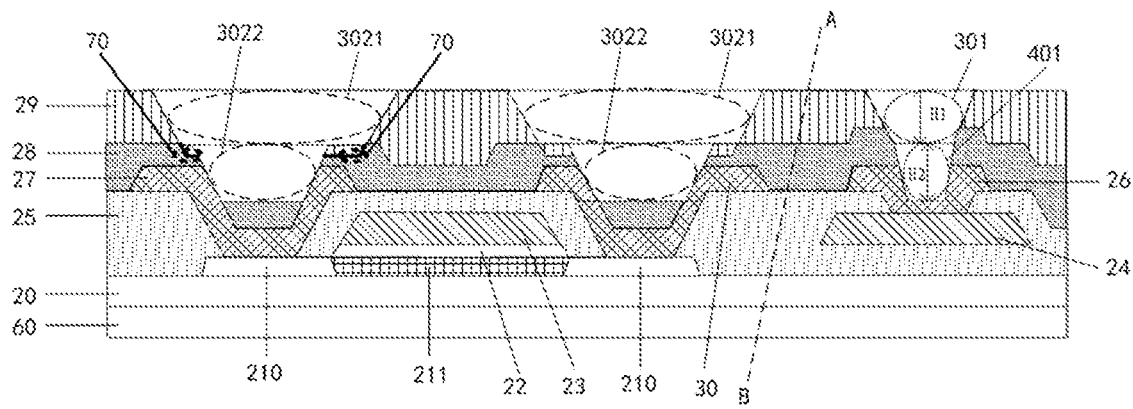
FIG. 9 is a diagram of an eighth displaying substrate provided by an embodiment of the disclosure.

Optionally, as shown in FIG. 9, the displaying substrate further comprises a supporting base 60, and the passivation layer 28 and the flat layer 29 are formed on the supporting base 60.

Optionally, each second flat via hole comprises a first flat sub-via hole 3021 and a second flat sub-via hole 3022 which are connected, the first flat sub-via hole 3021 is away from the supporting base 60, and the second flat sub-via hole 3022 is close to the supporting base 60. The step 70 is located on the side, close to the supporting base 60, of the first flat sub-via hole 3021, and adjacent to the second flat sub-via hole 3022.

Optionally, in the direction perpendicular to the supporting base, the cross section of the first flat sub-via hole and the cross section of the second flat sub-via hole each comprise a first top edge and a first bottom edge opposite the first top edge, the first top edges are away from the supporting base, and the first bottom edges are close to the supporting base; the lengths of the first top edges are greater than those of the first bottom edges; and the length of the first bottom edge of the first flat sub-via hole is greater than that of the first top edge of the second flat sub-via hole.

Figure 10:
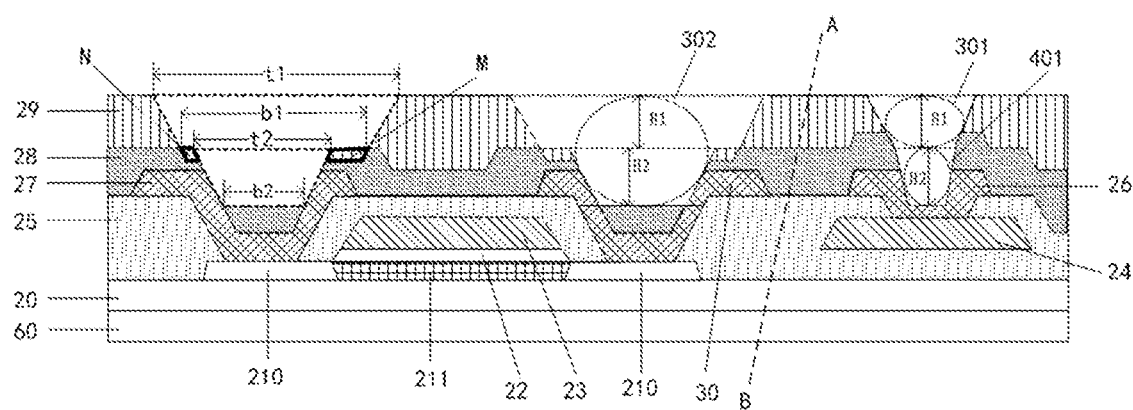
FIG. 10 is a diagram of a ninth displaying substrate provided by an embodiment of the disclosure.

By way of example, as shown in FIG. 10, taking the left second flat via hole as an example, the length t1 of the first top edge of the first flat sub-via hole is larger than the length b1 of the first bottom edge, the length t2 of the first top edge of the second flat sub-via hole is larger than the length b2 of the first bottom edge, and the length b1 of the first bottom edge of the first flat sub-via hole is larger than the length t2 of the first top edge of the second flat sub-via hole. Then, the flat layer will remain unetched in the M area and the N area shown in FIG. 10. In this way, on the one hand, the metal structure below can be protected, for example, the thickness above a second metal part (a source electrode 30 and a drain electrode 27 shown in FIG. 10) can be increased to better protect the second metal part from oxidation; and on the other hand, the manufacturing method of the displaying substrate can be deduced from this structure, which is more conducive to protecting products.

Optionally, as shown in FIG. 8, the displaying substrate further comprises a first metal layer, and the passivation layer covers the first metal layer.

The first metal layer comprises a first metal part 26 in the non-active area and a second metal part (comprising the source electrode 30 and the drain electrode 27) in the active area. The first metal part 26 is located below the first sleeve hole 31, and the second metal part is located below the plurality of second sleeve holes, wherein the source electrode 30 and the drain electrode 27 are respectively located below different second sleeve holes. Specifically, the source electrode 30 in the second metal part is located below the right second sleeve hole 32 and the drain electrode 27 is located below the left second sleeve hole 32.

Figure 11:
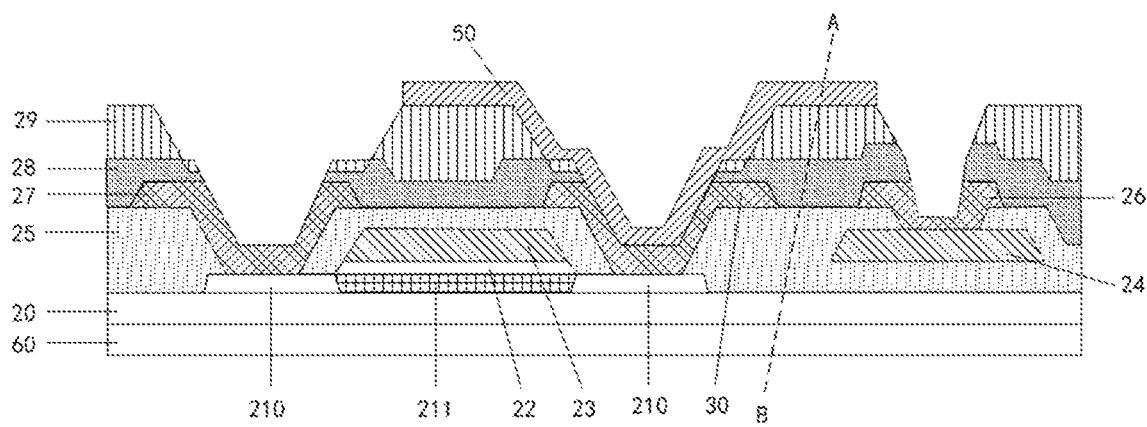
FIG. 11 is a diagram of a tenth displaying substrate provided by an embodiment of the disclosure.

Optionally, as shown in FIG. 11, the displaying substrate further comprises an anode 50, the anode 50 is located on the side, away from the passivation layer 28, of the flat layer 29, and the anode 50 is electrically connected with the second metal part through a second sleeve hole (not marked in FIG. 11). In FIG. 11, the anode 50 and the source electrode 30 are electrically connected.

Of course, as shown in FIG. 11, the above displaying substrate may also comprise a buffer layer 20, an active layer, a gate insulating layer (GI layer) 22, a gate metal layer (comprising a gate 23 located in the active area and an electrode 24 located in the non-active area), and an interlayer dielectric layer (ILD layer) 25, wherein the active layer comprises a semiconductor part (Act) 211 and conductive parts 210 located on both sides of the semiconductor part 211.

One can refer to the following embodiments for the manufacturing method of the displaying substrate and related contents provided by the embodiment of the disclosure, which will not be described in detail here.

An embodiment of the disclosure provides a display panel comprising the displaying substrate in the above embodiments. The difference between the via holes etched at different thicknesses of the flat layer of the display panel is small, which solves the problem of metal oxidation caused by over-etching and has the characteristics of high metal film layer overlapping quality and stable signal transmission.

The display panel can be a twisted nematic (TN) type liquid crystal display panel, a vertical alignment (VA) type liquid crystal display panel, an in-plane switching (IPS) type liquid crystal display panel or an advanced super dimension switch (ADS) type liquid crystal display panel, and can also be an OLED display panel, and any products or components with a display function such as televisions, digital cameras, mobile phones, and tablet computers comprising these display panels.

Figure 1:
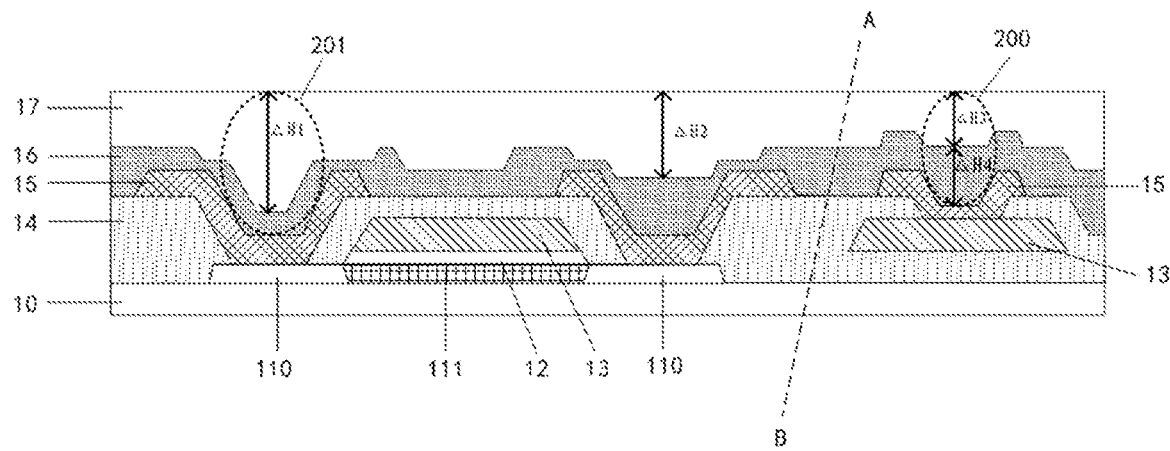
FIG. 1 is a diagram of a first displaying substrate in the related art.

When etching the flat layer (Resin layer) 17 and passivation layer (PVX layer) 16 of the displaying substrate shown in FIG. 1, in the related art, the flat layer is exposed first, and all the via holes of the flat layer are etched; and then the passivation layer is exposed, and all the via holes of the passivation layer are etched, so as to form a flat layer via hole and a passivation layer via hole at least in an area 201 and an area 200 respectively. However, to ensure the etching uniformity of different areas, the existing etching processes are prone to over-etching, which means that after etching the via holes at different thicknesses of the flat layer, the via holes in the flat layer located in the area 200 in the non-active area (S/B area) will be over-etched, and then after etching the via holes in the passivation layer, a metal layer 15 below will be oxidized, which will affect subsequent metal film layer overlapping and signal transmission. In addition, metal oxidation also exists at the sleeve hole formed by the flat layer via hole and the passivation layer via hole in the area 201 of the active area.

In FIG. 1, the left side of the dotted line AB is a thin film transistor area (TFT area) located in the active area, and the right side of the dotted line AB is the S/B area (short bar area) located in the non-active area. The dotted line AB between the TFT area and the S/B area in FIG. 1 indicates that the two areas are not directly adjacent, and other areas are arranged therebetween. The two areas are drawn together just to facilitate explanation. In FIG. 1, ΔH1, ΔH2 and ΔH3 respectively indicate that the flat layer has different thicknesses in different areas, and ΔH4 indicates the thickness of the passivation layer in this area. Of course, FIG. 1 also includes a buffer layer 10, an active layer, a gate insulating layer (GI layer) 12, a gate metal layer (gate layer) 13, an interlayer dielectric layer (ILD layer) 14, and a source/drain metal layer (SD layer) 15, wherein the active layer comprises a semiconductor part (Act) 111 and conductive parts (conductive Act) 110 on both sides of the semiconductor part 111.

An embodiment of the disclosure provides a manufacturing method of a displaying substrate, and the displaying substrate comprises an active area and a non-active area at least located on one side of the active area.

The above-mentioned active area (AA) refers to an area for display, and the non-active area refers to the area outside the active area, which may include a short bar area (for short circuit protection), a fanout area (for collecting metal wires in the active area), etc.

Figure 2:
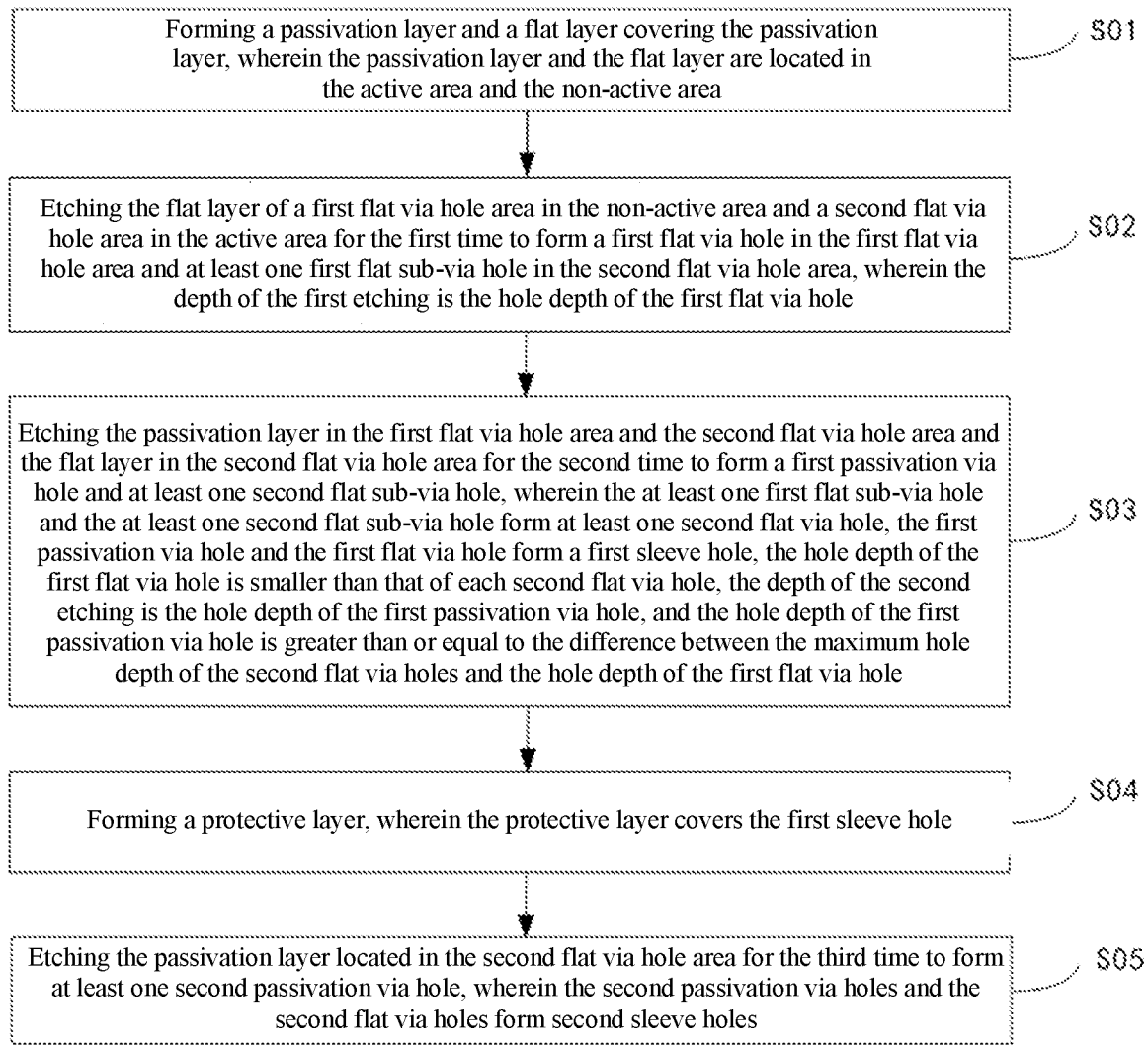
FIG. 2 is a flow diagram of a manufacturing method of a displaying substrate provided by an embodiment of the disclosure.
Figure 3:
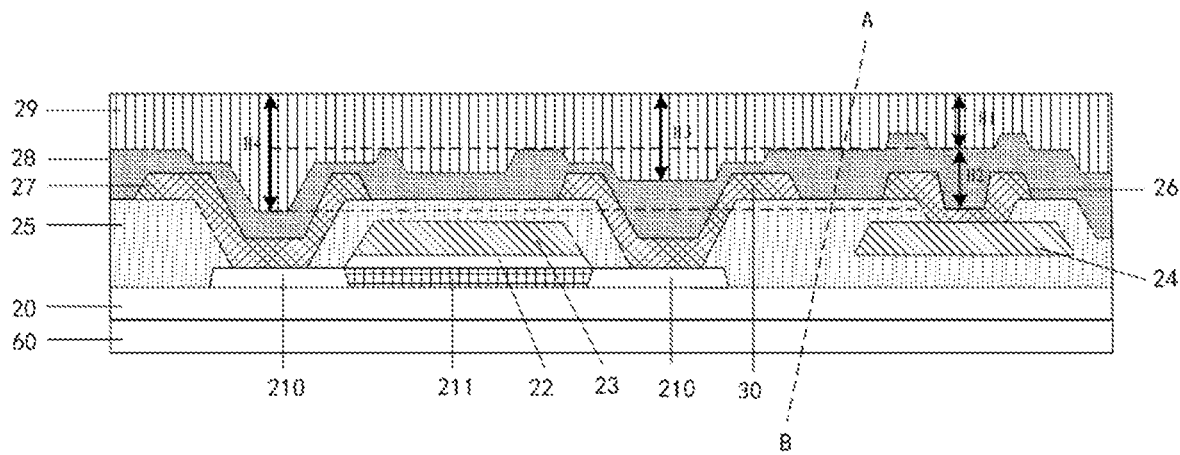
FIG. 3 is a diagram of a second displaying substrate provided by an embodiment of the disclosure.

As shown in FIG. 2, the method comprises:

S01, forming the passivation layer 28 and the flat layer 29 covering the passivation layer 28 as shown in FIG. 3, wherein the passivation layer is provided with a first passivation via hole area located in the non-active area and a second passivation via hole area located in the active area, and the passivation layer and the flat layer are located in the active area and the non-active area.

Here, the flat layer can be made of resin, such as silicon-organic (SOG). The forming method is not limited here, which may be a patterning process or an inkjet printing process. In order to improve the utilization rate of existing equipment, the former is often used. The patterning process is a process of forming a film into a layer containing at least one pattern. The patterning process generally comprises: coating a film with a photoresist, exposing the photoresist with a mask, washing off the photoresist to be removed with a developing solution, etching off the part of the film not covered with the photoresist, and finally stripping off the remaining photoresist. The passivation layer, also called PVX layer, can be made of an inorganic insulating material, such as silicon dioxide and silicon oxynitride.

Figure 4:
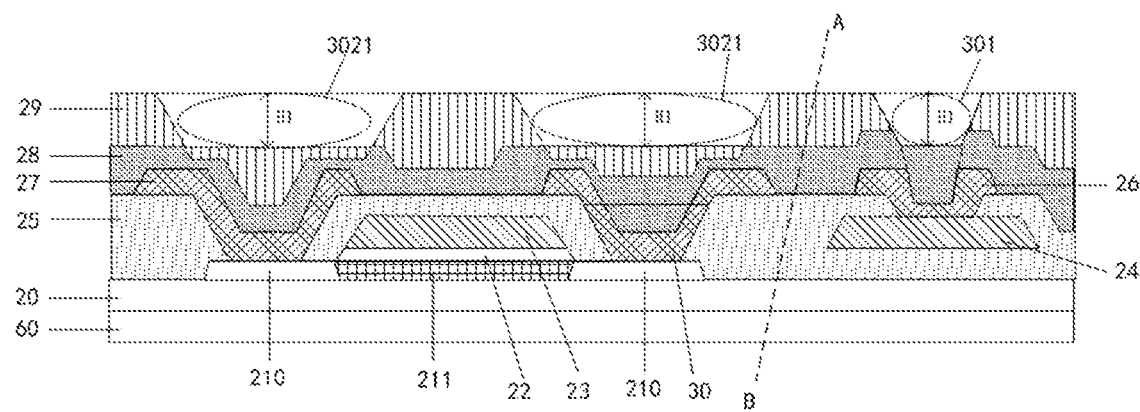
FIG. 4 is a diagram of a third displaying substrate provided by an embodiment of the disclosure.

S02, referring to FIG. 4, etching the flat layer of a first flat via hole area in the non-active area and a second flat via hole area in the active area for the first time to form a first flat via hole 301 in the first flat via hole area and a first flat sub-via hole 3021 in the second flat via hole area, wherein the depth of the first etching is the hole depth of the first flat via hole H1.

Here, the first flat via hole area can be located in the short bar area of the non-active area, and of course, it can also be other areas in the non-active area where via holes need to be formed. The embodiments of the disclosure and the drawings are explained by taking the former as an example.

Figure 5:
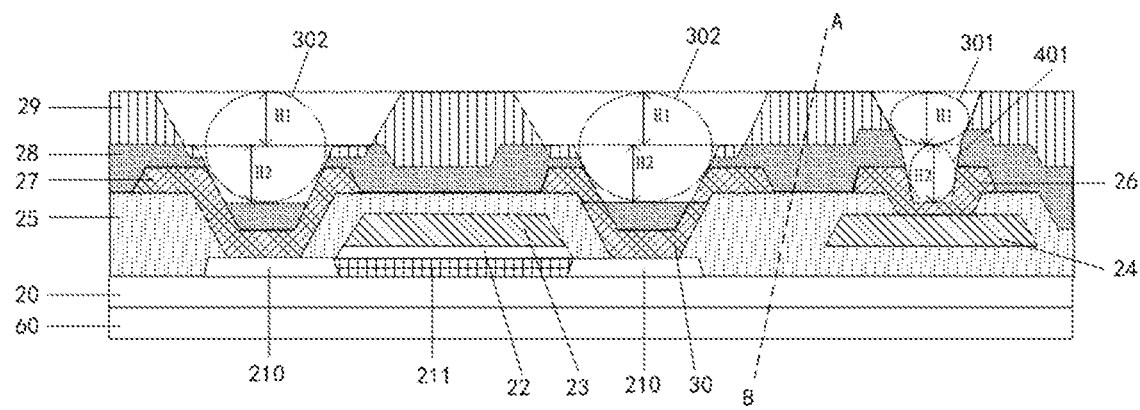
FIG. 5 is a diagram of a fourth displaying substrate provided by an embodiment of the disclosure.

S03. referring to FIG. 5, etching the passivation layer in the first flat via hole area and the second flat via hole area and the flat layer in the second flat via hole area for the second time to form a first passivation via hole 401 and at least one second flat sub-via hole (marked as 3022 in FIG. 9), wherein the at least one first flat sub-via hole and the at least one second flat sub-via hole form at least one second flat via hole 302, and the first passivation via hole 401 and the first flat via hole 301 form a first sleeve hole (marked as 31 in FIG. 8); referring to FIG. 3, the hole depth of the first flat via hole H1 is smaller than that of each second flat via hole (H3 and H4 in FIG. 3); and the depth of the second etching is the hole depth of the first passivation via hole (H2 in FIG. 3), and the hole depth of the first passivation via hole is greater than or equal to the difference between the maximum hole depth of the second flat via holes and the hole depth of the first flat via hole.

In FIG. 5, two second flat via holes 302 are shown. The hole depth of the left second flat via hole 302 corresponds to H4 in FIG. 3, the hole depth of the right second flat via hole 302 corresponds to H3 in FIG. 3, H4>H3, and H3>H1. The maximum hole depth of the two second flat via holes is H4, the hole depth of the first flat via hole is H1, and the hole depth of the first passivation via hole is H2. It can be seen from FIG. 3 that H4−H1=H2, so in FIG. 5, the depth of the second etching is taken as H2. That is, FIG. 5 is drawn by assuming that the depth of the second etching (that is, the hole depth of the first passivation via hole) is equal to the difference between the maximum hole depth of all the second flat via holes and the hole depth of the first flat via hole. For the situation that the depth of the second etching (that is, the hole depth of the first passivation via hole) is larger than the difference between the maximum hole depth of all the second flat via holes and the hole depth of the first flat via hole, please refer to the description of FIG. 5, which will not be described in detail here.

The at least one second flat via hole refers to one or more second flat via holes. Here, the specific positions and number of the second flat via holes are not limited, which depend on the actual situation. For example, if the above displaying substrate is applied to an OLED display panel, a passivation layer and a thin film transistor will be arranged below the flat layer in the active area, and an anode will be arranged above the flat layer. The thin film transistor comprises a gate, a gate insulating layer, an active layer, a source electrode and a drain electrode, and the anode is electrically connected with the source electrode. If the source electrode and the drain electrode are arranged below the passivation layer and make contact with the passivation layer, a second flat via hole and a second passivation via hole need to be arranged above the source electrode to realize the electrical connection with the anode. Of course, in this case, a second flat via hole and a second passivation via hole can also be provided above the drain electrode to realize the electrical connection between other film layers and the drain electrode.

If the number of the second flat via holes is greater than or equal to two, the hole depths of these second flat via holes can be the same or different, which needs to be determined according to the position and function.

The difference between the maximum hole depth of all the second flat via holes and the hole depth of the first flat via hole refers to a numerical value obtained by subtracting the hole depth of the first flat via from the maximum hole depth of all the second flat via holes.

S04, forming a protective layer, wherein the protective layer covers the first sleeve hole.

It should be noted that the protective layer can cover the first sleeve hole only, or it can also cover the portions in the active area except the second flat via hole area, which is not limited here. The embodiments of the disclosure and the accompanying drawings are described by taking the latter as an example.

Figure 6:
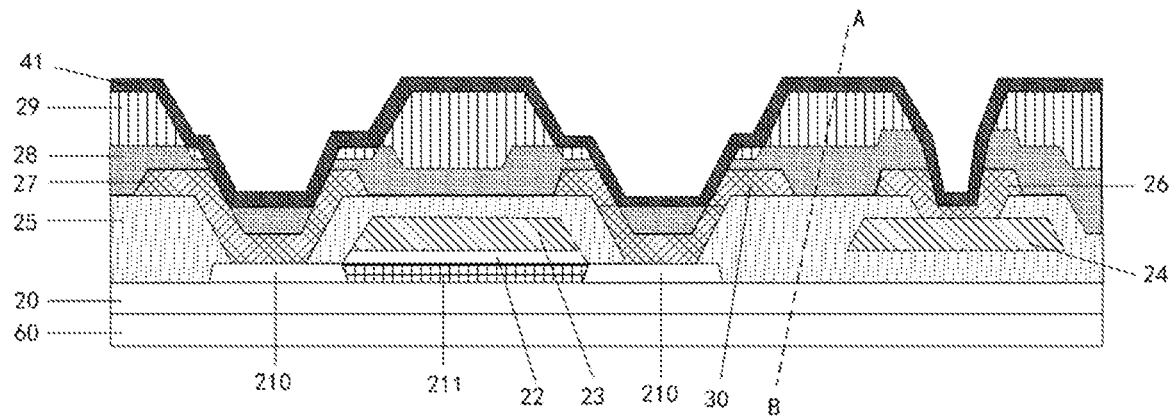
FIG. 6 is a diagram of a fifth displaying substrate provided by an embodiment of the disclosure.
Figure 7:
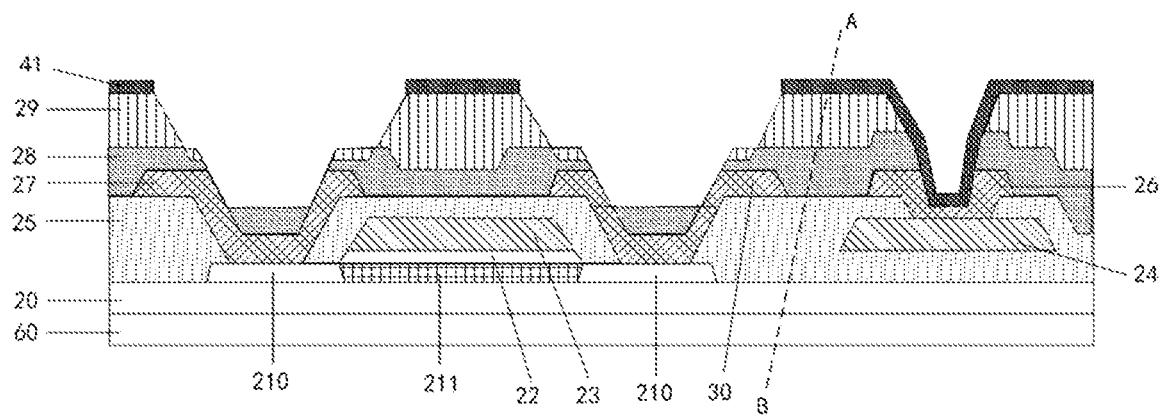
FIG. 7 is a diagram of a sixth displaying substrate provided by an embodiment of the disclosure.

The protective layer may be made of a photoresist. To simplify the process, as shown in FIG. 6, a layer of photoresist 41 may be coated on the whole, and the photoresist covers the flat layer, the passivation layer, the second flat via hole and the first sleeve hole. Then, after the photoresist is exposed and developed, the photoresist above the second flat via holes is removed, and the photoresist above the flat layer in the area except the second flat via hole area and the photoresist above the first sleeve hole are retained, so as to obtain the displaying substrate as shown in FIG. 7.

S05, referring to FIG. 8, etching the passivation layer located in the second flat via hole area for the third time to form at least one second passivation via hole (not marked in FIG. 8), wherein the second passivation via holes and the second flat via holes form second sleeve holes 32.

By way of example, the second passivation via hole and the second flat via hole are in a one-to-one correspondence relationship.

An embodiment of the disclosure provides a manufacturing method of a displaying substrate, and the displaying substrate comprises an active area and a non-active area at least located on one side of the active area. The method comprises: forming a passivation layer and a flat layer covering the passivation layer, wherein the passivation layer and the flat layer are located in the active area and the non-active area; etching the flat layer of a first flat via hole area in the non-active area and a second flat via hole area in the active area for the first time to form a first flat via hole in the first flat via hole area and at least one first flat sub-via hole in the second flat via hole area, wherein the depth of the first etching is the hole depth of the first flat via hole; etching the passivation layer in the first flat via hole area and the second flat via hole area and the flat layer in the second flat via hole area for the second time to form a first passivation via hole and at least one second flat sub-via hole, wherein the at least one first flat sub-via hole and the at least one second flat sub-via hole form at least one second flat via hole, the first passivation via hole and the first flat via hole form a first sleeve hole, the hole depth of the first flat via hole is smaller than that of each second flat via hole, the depth of the second etching is the hole depth of the first passivation via hole, and the hole depth of the first passivation via hole is greater than or equal to the difference between the maximum hole depth of the second flat via holes and the hole depth of the first flat via hole; forming a protective layer, wherein the protective layer covers the first sleeve hole; and etching the passivation layer located in the second flat via hole area for the third time to form at least one second passivation via hole, wherein the second passivation via holes and the second flat via holes form second sleeve holes.

When etching via holes at different thicknesses of the flat layer, the hole depth of the first flat via hole is small and the hole depth of the second flat via hole is large, so during the first etching, the hole depth of the first flat via hole is used as the etching depth, in this way, the first flat via hole will not be over-etched when the first flat via hole is formed. During the second etching, the etching depth is the hole depth of the first passivation via hole, and the hole depth of the first passivation via hole is greater than or equal to the difference between the maximum hole depth of all the second flat via holes and the hole depth of the first flat via hole, so that the first passivation via hole will not be over-etched when the first passivation via hole and at least one second flat via hole are formed. Before the third etching, the protective layer is used to cover the first sleeve hole, so the first flat via hole and the first passivation via hole will not be etched again during the third etching, thus preventing the first flat via hole and the first passivation via hole from being over-etched. To sum up, the above manufacturing method can solve the problem that a metal layer below the first flat via hole is oxidized due to over-etching, thereby reducing the influence on subsequent metal film layer overlapping and signal transmission. That is, the manufacturing method of the displaying substrate provided by the embodiment of the disclosure can reduce the via hole etching difference at different thicknesses of the flat layer, which solves the problem of metal oxidation caused by over-etching, thereby reducing the influence on subsequent metal film layer overlapping and signal transmission.

Optionally, in order to make the best use of existing processes and materials, the protective layer is made of a photoresist.

Optionally, as shown in FIG. 10, the displaying substrate further comprises a supporting base 60, and the passivation layer 28 and the flat layer 29 are formed on the supporting base 60.

In the direction perpendicular to the supporting base, the cross section of the first flat sub-via hole and the cross section of the second flat sub-via hole each comprise a first top edge and a first bottom edge opposite the first top edge, the first top edges are away from the supporting base, and the first bottom edges are close to the supporting base; and the lengths of the first top edges are greater than those of the first bottom edges.

The length of the first bottom edge of the first flat sub-via hole is greater than that of the first top edge of the second flat sub-via hole.

As shown in FIG. 10, the length t1 of the first top edge of the first flat sub-via hole is larger than the length b1 of the first bottom edge, the length t2 of the first top edge of the second flat sub-via hole is larger than the length b2 of the first bottom edge, and the length b1 of the first bottom edge of the first flat sub-via hole is larger than the length t2 of the first top edge of the second flat sub-via hole.

As shown in FIG. 10, taking the left second flat via hole as an example, during the second etching, hole etching is carried out according to the length t2 of the first top edge of the second flat sub-via hole, so that after the second etching, the flat layer will remain unetched in the M area and the N area shown in FIG. 10. In this way, on the one hand, the thickness above a second metal part can be increased to better protect the second metal part from oxidation; and on the other hand, the above manufacturing method can be deduced from this structure, which is more conducive to protecting products.

Optionally, before forming a passivation layer and a flat layer covering the passivation layer in S01, the above method further comprises:

S06, forming a first metal layer, wherein the passivation layer covers the first metal layer.

Referring to FIG. 3, the first metal layer comprises a first metal part 26 located in the non-active area and a second metal part (comprising a source electrode 30 and a drain electrode 27) located in the active area.

The material of the first metal layer is not limited, and can be copper, silver, etc.

Further optionally, in S03, the second etching further comprises:
referring to FIG. 5, after the first passivation via hole 401 is formed, exposing the first metal part 26.

Further optionally, in S05, the third etching further comprises:
referring to FIG. 8, after the at least one second passivation via hole is formed, exposing the second metal part (comprising the source electrode 30 and the drain electrode 27).

Optionally, the first metal layer may be a source-drain metal layer, and the second metal part comprises a source electrode and a drain electrode. Here, the materials of the source electrode and the drain electrode are not limited, but may be metal (for example, copper).

Further optionally, after the third etching in S05, the method further comprises:

S07, referring to FIG. 11, forming an anode 50 on the flat layer 29, wherein the anode 50 is in contact with the source electrode 30 through the second sleeve hole above the source electrode, and at this point, the anode is electrically connected with the second metal part (i.e., the source electrode), and the second metal part can be used for supplying power to the anode.

Further optionally, before forming the first metal layer in S06, the method further comprises:

S08, referring to FIG. 3, sequentially forming an active layer, a gate insulating layer 22, a gate metal layer and an interlayer dielectric layer, wherein the first metal layer is formed on the interlayer dielectric layer, the active layer comprises a semiconductor part 211 and conductive parts 210 located on both sides of the semiconductor part 211, and the source electrode 30 and the drain electrode 27 are electrically connected with the conductive parts 210 respectively; in FIG. 3, the gate metal layer comprises a gate 23 located in the active area and an electrode 24 located in the short bar (S/B) area of the non-active area; in this way, after S07 and S04, a thin film transistor can be formed. The material of the active layer is an oxide semiconductor material, such as indium gallium zinc oxide (IGZO), indium tin zinc oxide (ITZO), indium zinc oxide (IZO), etc.

A specific embodiment is provided below to explain the disclosure in detail, where two second flat via holes are formed in the second flat via hole area. The manufacturing method of the displaying substrate comprises the following steps:

S101, forming a buffer layer located in an active area and a non-active area on a supporting base;

S102, sequentially forming an active layer, a gate insulating layer (GI), a gate metal layer (gate) and an interlayer dielectric layer (ILD) on the buffer layer, wherein the gate metal layer comprises a gate located in the active area and an electrode located in a short bar (S/B) area of the non-active area, the active layer comprises a semiconductor part (Act) and conductive parts (conductive Act) located on both sides of the semiconductor part (act), and the active layer, the gate insulating layer (GI) and the gate are all located in a thin film transistor (TFT) area of the active area;

S103, forming a source/drain metal layer (S/D layer) on the interlayer dielectric layer (ILD), wherein the source-drain metal layer, i.e., a first metal layer, comprises a source electrode and a drain electrode (i.e., a second metal part) located in the thin film transistor area, and a first metal part located in the S/B area, and the source electrode and the drain electrode are electrically connected with the conductive parts respectively;

S104, forming a passivation layer and a flat layer covering the passivation layer, wherein the passivation layer covers the source-drain metal layer, and the passivation layer and flat layer are located in the active area and the non-active area, thereby forming the displaying substrate as shown in FIG. 3;

S105, referring to FIG. 4, etching a first flat via hole area located in the S/B area and a second flat via hole area located in the thin film transistor area in the flat layer for the first time to form a first flat via hole 301 and a first flat sub-via hole 3021, wherein the depth of the first etching is the hole depth of the first flat via hole H1;

S106, referring to FIG. 5, etching the second flat via hole area for the second time to form a first passivation via hole 401 and two second flat sub-via holes (marked as 3022 in FIG. 9), wherein the two groups of first flat sub-via holes and second flat sub-via holes form two second flat via holes 302 (source flat via hole and drain flat via hole), the first passivation via hole 301 and the first flat via hole 401 form a first sleeve hole (marked as 31 in FIG. 8), at this point, the first metal part 26 is exposed, and the hole depth of the first flat via hole is smaller than that of the two second flat via holes;

and the depth of the second etching is the hole depth of the first passivation via hole, and the hole depth of the first passivation via hole (H2) is equal to the difference between the maximum hole depth of the two second flat via holes (H4) and the hole depth of the first flat via hole (H1), thereby forming the displaying substrate as shown in FIG. 5;

S107, referring to FIG. 6, coating a photoresist 41, wherein the photoresist covers the flat layer, the passivation layer, the second flat via holes and the first sleeve hole;

S108, after the photoresist is exposed and developed, removing the photoresist above the second flat via holes, and retaining the photoresist above the flat layer in the area except the second flat via hole area and the photoresist above the first sleeve hole, so as to obtain the displaying substrate as shown in FIG. 7;

S109, referring to FIG. 8, etching the passivation layer located in the second flat via hole area for the third time to form two second passivation via holes (source passivation via hole and drain passivation via hole) and expose the second metal part (comprising the source electrode 30 and the drain electrode 27), wherein the second passivation via holes and the second flat via holes form second sleeve holes 32 through one-to-one correspondence, that is, the two second flat via holes (source flat via hole and drain flat via hole) and the two corresponding second passivation via holes (source passivation via hole and drain passivation via hole) form two second sleeve holes (source sleeve hole and drain sleeve hole) respectively, and the displaying substrate shown in FIG. 8 is a structure formed after the remaining photoresist is stripped after the third etching; and S110, referring to FIG. 11, forming an anode 50 on the flat layer 29, wherein the anode 50 is in contact with the source electrode 30 through the second sleeve hole above the source electrode (i.e., source sleeve hole).

The above are only specific embodiments of the disclosure, but the protection scope of the disclosure is not limited thereto. Anyone skilled in the art can easily think of changes or substitutions within the technical scope disclosed in the disclosure, which should be covered within the protection scope of the disclosure. Therefore, the protection scope of the disclosure shall be subject to the protection scope of the Claims.

The invention claimed is:

1. A displaying substrate, wherein the displaying substrate comprises an active area and a non-active area at least located on one side of the active area; the displaying substrate further comprises a passivation layer and a flat layer covering the passivation layer, and the passivation layer and the flat layer are located in the active area and the non-active area;

the flat layer comprises a first flat via hole in the non-active area and a plurality of second flat via holes in the active area;

the passivation layer comprises a first passivation via hole located in the non-active area, and the first flat via hole and the first passivation via hole form a first sleeve hole; and the hole depth of the first flat via hole is smaller than that of each second flat via hole, and the hole depth of the first passivation via hole is greater than or equal to the difference between the maximum hole depth of the second flat via holes and the hole depth of the first flat via hole.

2. The displaying substrate according to claim 1, wherein the passivation layer further comprises a plurality of second passivation via holes located in the active area;

the plurality of second flat via holes and the plurality of second passivation via holes form a plurality of second sleeve holes; and the passivation layer and the flat layer form a step on an inner wall of each second sleeve hole, and a partial flat layer is arranged on the step.

3. The displaying substrate according to claim 2, wherein the displaying substrate further comprises a supporting base, and the passivation layer and the flat layer are formed on the supporting base.

4. The displaying substrate according to claim 3, wherein each second flat via hole comprises a first flat sub-via hole and a second flat sub-via hole which are connected to each other, the first flat sub-via hole is away from the supporting base, and the second flat sub- via hole is close to the supporting base; and the step is located at one side of the first flat sub-via hole close to the supporting base, and is adjacent to the second flat sub-via hole.

5. The displaying substrate according to claim 4, wherein in a direction perpendicular to the supporting base, the cross section of the first flat sub-via hole and the cross section of the second flat sub-via hole each comprise a first top edge and a first bottom edge opposite the first top edge, the first top edges are away from the supporting base, and the first bottom edges are close to the supporting base; the lengths of the first top edges are greater than those of the first bottom edges; and the length of the first bottom edge of the first flat sub-via hole is greater than that of the first top edge of the second flat sub-via hole.

6. The displaying substrate according to claim 2, wherein the displaying substrate further comprises a first metal layer, and the passivation layer covers the first metal layer; and the first metal layer comprises a first metal part in the non-active area and a second metal part in the active area, the first metal part is located below the first sleeve hole, and the second metal part is located below the plurality of second sleeve holes.

7. The displaying substrate according to claim 6, wherein the second metal part comprises a source electrode and a drain electrode, and the source electrode and the drain electrode are located below different instances of the second sleeve holes.

8. The displaying substrate according to claim 6, wherein the displaying substrate further comprises an anode, the anode is located on one side of the flat layer away from the passivation layer, and the anode is electrically connected with the second metal part through the second sleeve hole.

9. The displaying substrate according to claim 1, wherein the displaying substrate further comprises a buffer layer, an active layer, a gate insulating layer, a gate metal layer and an interlayer dielectric layer,
the active layer comprises a semiconductor part and conductive parts on both sides of the semiconductor part, and the gate metal layer comprises a gate located in the active area and an electrode located in the non-active area.

10. A display panel, comprising the displaying substrate according to claim 1.

11. The display panel according to claim 10, wherein the display panel is at least one of a twisted nematic type liquid crystal display panel, a vertical alignment type liquid crystal display panel, an in-plane switching type liquid crystal display panel, an advanced super dimension switch type liquid crystal display panel and an OLED display panel.

12. A manufacturing method of a displaying substrate, wherein the method comprises:
forming a passivation layer and a flat layer covering the passivation layer, wherein the passivation layer and the flat layer are located in the active area and the non-active area;
etching the flat layer of a first flat via hole area in the non-active area and a second flat via hole area in the active area for the first time to form a first flat via hole in the first flat via hole area and at least one first flat sub-via hole in the second flat via hole area, wherein the depth of the first etching is the hole depth of the first flat via hole; and
etching the passivation layer in the first flat via hole area and the second flat via hole area and the flat layer in the second flat via hole area for the second time to form a first passivation via hole and at least one second flat sub-via hole, wherein the at least one first flat sub-via hole and the at least one second flat sub-via hole form at least one second flat via hole, the first passivation via hole and the first flat via hole form a first sleeve hole, the hole depth of the first flat via hole is less than that of each second flat via hole, the depth of the second etching is the hole depth of the first passivation via hole, and the hole depth of the first passivation via hole is greater than or equal to the difference between the maximum hole depth of the second flat via holes and the hole depth of the first flat via hole.

13. The manufacturing method according to claim 12, wherein the method further comprises:
forming a protective layer, wherein the protective layer covers the first sleeve hole; and
etching the passivation layer located in the second flat via hole area for the third time to form at least one second passivation via hole, wherein the second passivation via holes and the second flat via holes form second sleeve holes.

14. The manufacturing method according to claim 13, wherein the displaying substrate further comprises a supporting base, and the passivation layer and the flat layer are formed on the supporting base;
in the direction perpendicular to the supporting base, the cross section of the first flat sub-via hole and the cross section of the second flat sub-via hole each comprise a first top edge and a first bottom edge opposite the first top edge, the first top edges are away from the supporting base, and the first bottom edges are close to the supporting base; the lengths of the first top edges are greater than those of the first bottom edges; and
the length of the first bottom edge of the first flat sub-via hole is greater than that of the first top edge of the second flat sub-via hole.

15. The manufacturing method according to claim 14, wherein before forming a passivation layer and a flat layer covering the passivation layer, the method further comprises:
forming a first metal layer, wherein the passivation layer covers the first metal layer, and
the first metal layer comprises a first metal part located in the non-active area and a second metal part located in the active area.

16. The manufacturing method according to claim 15, wherein the second etching further comprises:
exposing the first metal part after the first passivation via hole is formed.

17. The manufacturing method according to claim 15, wherein the third etching further comprises:
exposing the second metal part after at least one second passivation via hole is formed.

18. The manufacturing method according to claim 17, wherein the first metal layer is a source-drain metal layer, and the second metal part comprises a source electrode and a drain electrode; and
after the third etching, the method further comprises:
forming an anode on the flat layer, wherein the anode is in contact with the source electrode through the second sleeve hole above the source electrode.

19. The manufacturing method according to claim 18, wherein before forming a first metal layer, the method further comprises:
sequentially forming an active layer, a gate insulating layer, a gate metal layer and an interlayer dielectric layer; and
the first metal layer is formed on the interlayer dielectric layer, the active layer comprises a semiconductor part and conductive parts on both sides of the semiconductor part, and the source electrode and the drain electrode are electrically connected with the conductive parts respectively.

20. The manufacturing method according to claim 19, wherein before sequentially forming an active layer, a gate insulating layer and a gate metal layer, the method further comprises:
forming a buffer layer located in the active area and the non-active area on the supporting base.

* * * * *